US008694445B1

(12) United States Patent
Sandler et al.

(10) Patent No.: US 8,694,445 B1
(45) Date of Patent: *Apr. 8, 2014

(54) TRIGGERING ATTRACT MODE FOR DEVICES USING VIEWABILITY CONDITIONS AND DETECTED PROXIMITY OF HUMAN TO DEVICE

(71) Applicant: Google Inc., Mountain View, CA (US)

(72) Inventors: Daniel Robert Sandler, Mountain View, CA (US); Gabriel Cohen, Mountain View, CA (US); Christopher Richard Wren, Mountain View, CA (US); John Spurlock, Mountain View, CA (US)

(73) Assignee: Google Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/766,441

(22) Filed: Feb. 13, 2013

Related U.S. Application Data

(63) Continuation of application No. 13/660,631, filed on Oct. 25, 2012, now Pat. No. 8,401,981.

(60) Provisional application No. 61/717,333, filed on Oct. 23, 2012.

(51) Int. Cl.
    *G06F 15/18* (2006.01)
(52) U.S. Cl.
    USPC .......................................................... 706/12
(58) Field of Classification Search
    USPC ................................ 706/12, 45, 62; 320/137
    See application file for complete search history.

(56) References Cited

U.S. PATENT DOCUMENTS

| 8,057,303 | B2  |   | 11/2011 | Rasmussen et al. |
|-----------|-----|---|---------|------------------|
| 8,241,119 | B2  |   | 8/2012  | Wells            |
| 2003/0066073 | A1 |  | 4/2003  | Rebh             |
| 2005/0068311 | A1 |  | 3/2005  | Fletcher et al.  |
| 2006/0139326 | A1 | * | 6/2006 | Tsukamoto ................... 345/158 |
| 2007/0077784 | A1 |  | 4/2007  | Kalayjian et al. |
| 2008/0111698 | A1 |  | 5/2008  | Atherton         |
| 2009/0160541 | A1 |  | 6/2009  | Liu et al.       |

(Continued)

OTHER PUBLICATIONS

Smart Actions Motorola Smartactions™: Uncover the secret super powers of your phone, The Official Motorola Blog, Nov. 17, 2011, 1 page.

(Continued)

*Primary Examiner* — David Vincent
(74) *Attorney, Agent, or Firm* — McDonnell Boehnen Hulbert & Berghoff LLP

(57) ABSTRACT

A data processing device may be operable to determine whether the data processing device is in a state of charging a battery. When the data processing device is determined to be in the state of charging the battery, a charging condition of the battery may be analyzed by the data processing device. The data processing device may analyze a viewability condition at a display module. The data processing device may analyze an environmental condition associated with proximity of a human to the data processing device. The data processing device may then choose, based on a result of the analysis of the charging condition, a result of the analysis of the viewability condition and/or a result of the analysis of the environmental condition, display of content in a manner to attract attention to the data processing device.

19 Claims, 6 Drawing Sheets

(56) References Cited

U.S. PATENT DOCUMENTS

| | | | |
|---|---|---|---|
| 2011/0039605 A1* | 2/2011 | Choi et al. | 455/573 |
| 2011/0040989 A1 | 2/2011 | Keyes | |
| 2011/0234152 A1* | 9/2011 | Frossen et al. | 320/107 |
| 2011/0260689 A1 | 10/2011 | Kano | |
| 2012/0108293 A1 | 5/2012 | Law et al. | |
| 2012/0324384 A1 | 12/2012 | Cohen et al. | |

OTHER PUBLICATIONS

Shin, et al., Understanding and Prediction of Mobile Application Usage for Smart Phones, Carnegie Mellon University, Human-Computer Interaction Institute, Pittsburgh, PA, pp. 173-182.

International Search Report and Written Opinion prepared by the European Patent Office in International Application No. PCT/US13/063618, mailed Dec. 5, 2013.

* cited by examiner

TRIGGERING ATTRACT MODE FOR DEVICES USING VIEWABILITY CONDITIONS AND DETECTED PROXIMITY OF HUMAN TO DEVICE

CROSS-REFERENCE TO RELATED APPLICATIONS/INCORPORATION BY REFERENCE

This application is a continuation of U.S. application Ser. No. 13/660,631 filed Oct. 25, 2012, which in turn makes reference to, claims priority to and claims the benefit of U.S. Provisional Patent Application Ser. No. 61/717,333 filed on Oct. 23, 2012.

Each of the above stated applications is hereby incorporated herein by reference in its entirety.

FIELD

Certain embodiments of the disclosure relate to attract mode display. More specifically, certain embodiments of the disclosure relate to a method and system for triggering attract mode for devices.

BACKGROUND

A data processing device, such as, for example, a smart phone, a mobile phone, a tablet and/or other similar device, may be in an attract mode to display content in a manner to attract people's attention to the data processing device. An attract mode may be triggered or activated when, for example, the data processing device is idle or inactive. However, displaying content in an attract mode may consume power source such as a battery of the data processing device. If an attract mode is activated when the data processing device is in a state of charging a battery, the charging of the battery may be affected or not efficient. In instances when a display screen of the data processing device is in an unviewable condition, activating an attract mode by the data processing device to display content may not be useful or necessary.

Further limitations and disadvantages of conventional and traditional approaches will become apparent to one of skill in the art, through comparison of such systems with the present disclosure as set forth in the remainder of the present application with reference to the drawings.

BRIEF SUMMARY OF THE DISCLOSURE

Aspects of the present disclosure are directed to a method and system for triggering attract mode for devices. In various embodiments of the disclosure, a data processing device, such as, for example, a smart phone, a mobile phone, a tablet or other similar device, may detect and determine that the data processing device is inactive or idle. The inactive data processing device may determine whether the data processing device is in a state of charging a battery of the data processing device. In instances when the data processing device is determined to be in the state of charging the battery, the data processing device may analyze a charging condition of the battery. A viewability condition at a display module of the data processing device may be analyzed by the data processing device. An environmental condition associated with proximity of a human to the data processing device may also be analyzed by the data processing device. The data processing device may then choose, based on results of the analysis of the charging condition, the analysis of the viewability condition and/or the analysis of the environmental condition, display of content in a manner to attract attention to the data processing device.

Various advantages, aspects and novel features of the present disclosure, as well as details of an illustrated embodiment thereof, will be more fully understood from the following description and drawings.

DETAILED DESCRIPTION

Figure 1:
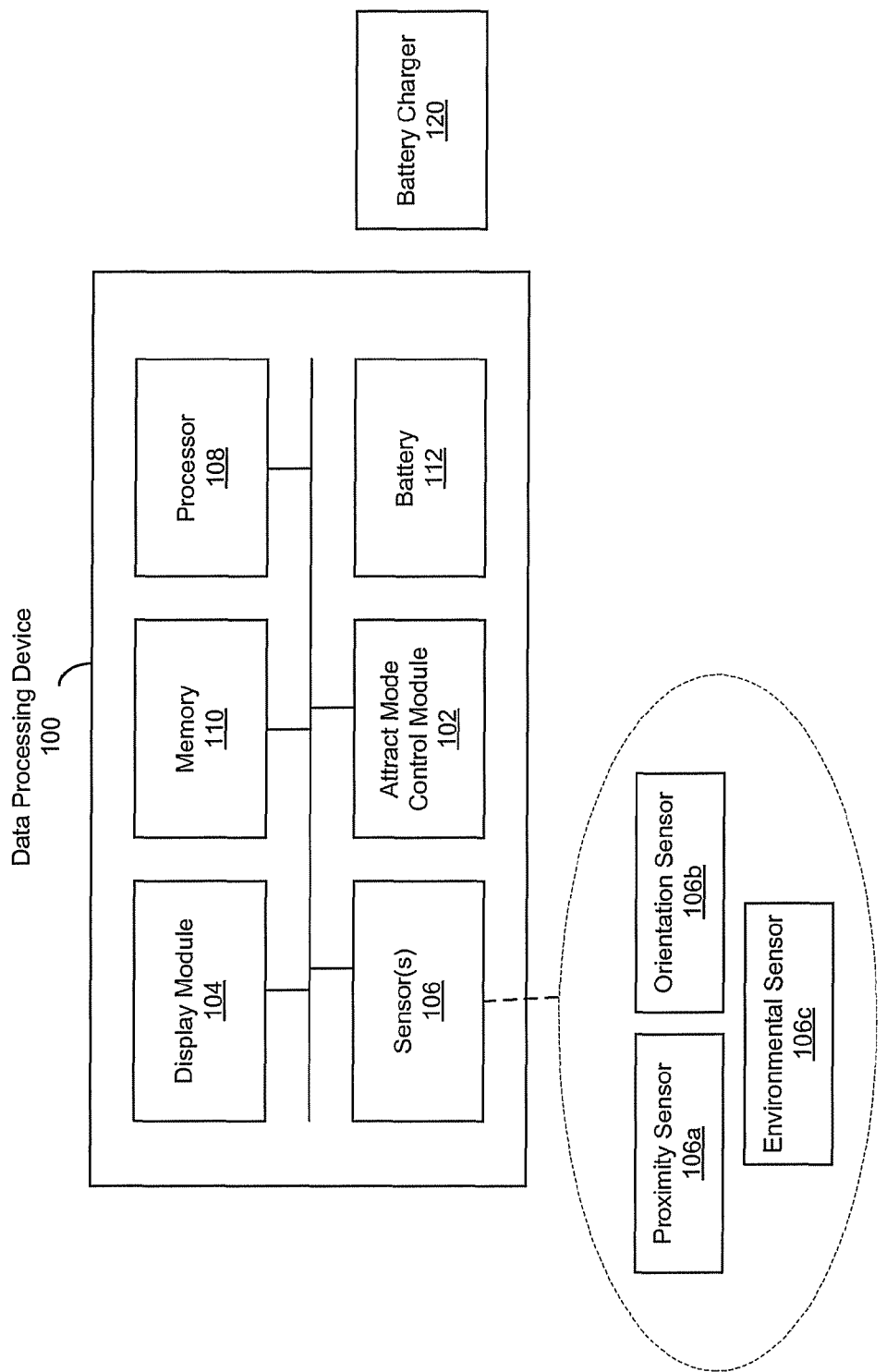
FIG. 1 is a block diagram illustrating an example data processing device, in accordance with an embodiment of the disclosure.

Certain embodiments of the disclosure can be found in a method and system for triggering attract mode for devices. Certain specific details are set forth in the following description and in drawings to provide a thorough understanding of various embodiments of the disclosure. Additional embodiments of the present disclosure may be practiced without several of the details described in the following description.

In various embodiments of the disclosure, a data processing device may be operable to determine that the data processing device is inactive. The data processing device may be operable to determine whether the data processing device is in a state of charging a battery of the data processing device. In instances when the data processing device is determined to be in the state of charging the battery, a charging condition of the battery may be analyzed by the data processing device. The data processing device may be operable to analyze a viewability condition at a display module of the data processing device. An environmental condition associated with proximity of a human to the data processing device may also be analyzed by the data processing device. The data processing device may then be operable to choose, based on a result of the analysis of the charging condition, a result of the analysis of the viewability condition and/or a result of the analysis of the environmental condition, display of content in a manner to attract attention to the data processing device. In this regard, the content displayed may comprise, for example, a screensaver, a clock display, a news ticker, a photo frame, a game demo, a puzzle and/or other interactive content.

In an example embodiment of the disclosure, the data processing device may be operable to receive input comprising indication of disabling or enabling a portion of the analysis of the charging condition, a portion of the analysis of the viewability condition and/or a portion of the analysis of the environmental condition. The data processing device may then be operable to disable or enable, based on the received input, the portion of the analysis of the charging condition, the portion of the analysis of the viewability condition and/or the portion of the analysis of the environmental condition.

In an example embodiment of the disclosure, in instances when the result of the analysis of the charging condition indicates that the battery is being charged at a rate lower than a particular rate, the data processing device may be operable to prevent activation of the display of the content. In instances when the result of the analysis of the charging condition indicates that the battery is being charged at a rate lower than a particular rate with the display of the chosen content, the data processing device may be operable to deactivate the display of the chosen content or choose display of a different content if the display of the different content may cause the battery being charged at a rate equal to or higher than the particular rate. In instances when the result of the analysis of the charging condition indicates that the battery starts being charged at a battery level below a particular threshold, the data processing device may be operable to prevent activation of the display of the content.

In an example embodiment of the disclosure, the data processing device may be operable to analyze, based on sensing information collected from a proximity sensor in the data processing device, whether the display module of the data processing device is in an unviewable condition due to display-side down or an object covering the display module. In instances when the display module is analyzed to be unviewable, the data processing device may be operable to prevent activation of the display of the content. In some instances, the proximity sensor may be utilized for collecting the sensing information, for example, within a first time window starting at a time that the battery starts being charged.

In an example embodiment of the disclosure, the data processing device may be operable to analyze, based on sensing information collected from an orientation sensor in the data processing device, whether the display module of the data processing device is in an unviewable condition or in a viewable condition due to an angle the data processing device is oriented at relative to a horizontal plane. In instances when the angle is analyzed to be smaller than a particular angle, the data processing device may be operable to prevent activation of the display of the content. In instances when the angle is analyzed to be equal to or greater than the particular angle, the data processing device may be operable to choose the display of the content based on the angle. In some instances, the orientation sensor may be utilized for collecting the sensing information, for example, within a second time window starting at a time that the battery starts being charged. In this regard, the orientation sensor may comprise, for example, an accelerometer and/or a gyroscope.

In an example embodiment of the disclosure, the data processing device may be operable to analyze, based on sensing information collected from an environmental sensor in the data processing device, the environmental condition associated with proximity of the human to the data processing device. The data processing device may be operable to activate or deactivate, based on the result of the analysis of the environmental condition, the display of the content. In this regard, the environmental sensor may comprise, for example, an acoustic sensor, a motion sensor and/or a thermal sensor.

FIG. 1 is a block diagram illustrating an example data processing device, in accordance with an embodiment of the disclosure. Referring to FIG. 1, there is shown a data processing device 100. The data processing device 100 may be, for example, a smart phone, a mobile phone, a tablet and/or other similar type of device. The data processing device 100 may comprise a processor 108, a memory 110, a display module 104, an attract mode control module 102 and one or more sensors 106. The data processing device 100 may be powered, for example, by a battery 112. The battery 112 may be charged via connection to a battery charger 120.

The processor 108 may comprise suitable logic, circuitry, interfaces and/or code that may be operable to process data or signals. The processor 108 may be operable to manage and/or control operations of various components or modules in the data processing device 100 such as, for example, the display module 104, the attract mode control module 102 and/or the sensor(s) 106. The processor 108 may utilize an operating system that enables the execution of various applications.

The memory 110 may comprise suitable logic, circuitry, interfaces and/or code that may be operable to store information such as executable instructions and/or data that may be utilized by the processor 108 and/or other modules or components in the data processing device 100. The memory 110 may comprise RAM, ROM, low latency nonvolatile memory such as flash memory and/or other suitable electronic data storage.

The display module 104 may comprise suitable logic, circuitry, interfaces and/or code that may be operable to display or present processed content to a user. The display module 104 may be integrated within or operatively coupled to the data processing device 100, for example. In an example embodiment of the disclosure, the display module 104 may be operable to display content in a manner to attract attention to the data processing device 100 when the data processing device 100 is inactive and/or in an attract mode.

The attract mode control module 102 may comprise suitable logic, circuitry, interfaces and/or code that may be operable to perform attract mode control functions for the data processing device 100. In an example embodiment of the disclosure, the attract mode control module 102 may be operable to analyze a charging condition of the battery 112, a viewability condition of the display module 104 and/or an environmental condition associated with proximity of a human, when the data processing device 100 is inactive or idle. The attract mode control module 102 may then be operable to choose display of content based on results of the analyses. For example, based on the results of the analyses, the attract mode control module 102 may activate or deactivate the display of the content, may prevent activation of the display of the content and/or may choose display of a different content. The attract mode control module 102 may, for example, utilize sensing information collected from the one or more sensors 106.

The sensor(s) 106 may comprise suitable logic, circuitry, interfaces and/or code that may be operable to collect sensing information. The sensor(s) 106 may comprise, for example, a proximity sensor 106a, an orientation sensor 106b and/or an environmental sensor 106c. In an example embodiment of the disclosure, the collected sensing information may be communicated to the attract mode control module 102 for controlling display of content when the data processing device 100 is inactive and/or in an attract mode.

In operation, the processor 108 may be operable to determine that the data processing device 100 is currently inactive or idle. The processor 108 may be operable to determine whether the data processing device 100 is also in a state of charging the battery 112. In instances when the data processing device 100 is determined to be in the state of charging the battery 112, a charging condition of the battery 112 may be analyzed by the attract mode control module 102. The attract mode control module 102 may be operable to analyze a viewability condition at the display module 104. The viewability condition may be analyzed, for example, based on sensing information collected from the proximity sensor 106a and/or from the orientation sensor 106b. The attract mode control module 102 may also be operable to analyze an environmental condition associated with proximity of a human to the data processing device 100. The environmental condition may be analyzed, for example, based on sensing information collected from the environmental sensor 106c. The attract mode control module 102 may then be operable to choose, based on a result of the analysis of the charging condition, a result of the analysis of the viewability condition and/or a result of the analysis of the environmental condition, display of content, at the display module 104, in a manner to attract attention to the data processing device 100. The content displayed at the display module 104 may comprise, for example, a screensaver, a clock display, a news ticker, a photo frame, a game demo, a puzzle and/or other interactive content.

In an example embodiment of the disclosure, the data processing device 100 may be operable to receive input comprising indication of disabling or enabling a portion of the analysis of the charging condition, a portion of the analysis of the viewability condition and/or a portion of the analysis of the environmental condition. The attract mode control module 102 may then be operable to disable or enable, based on the received input, the portion of the analysis of the charging condition, the portion of the analysis of the viewability condition and/or the portion of the analysis of the environmental condition.

Figure 2:
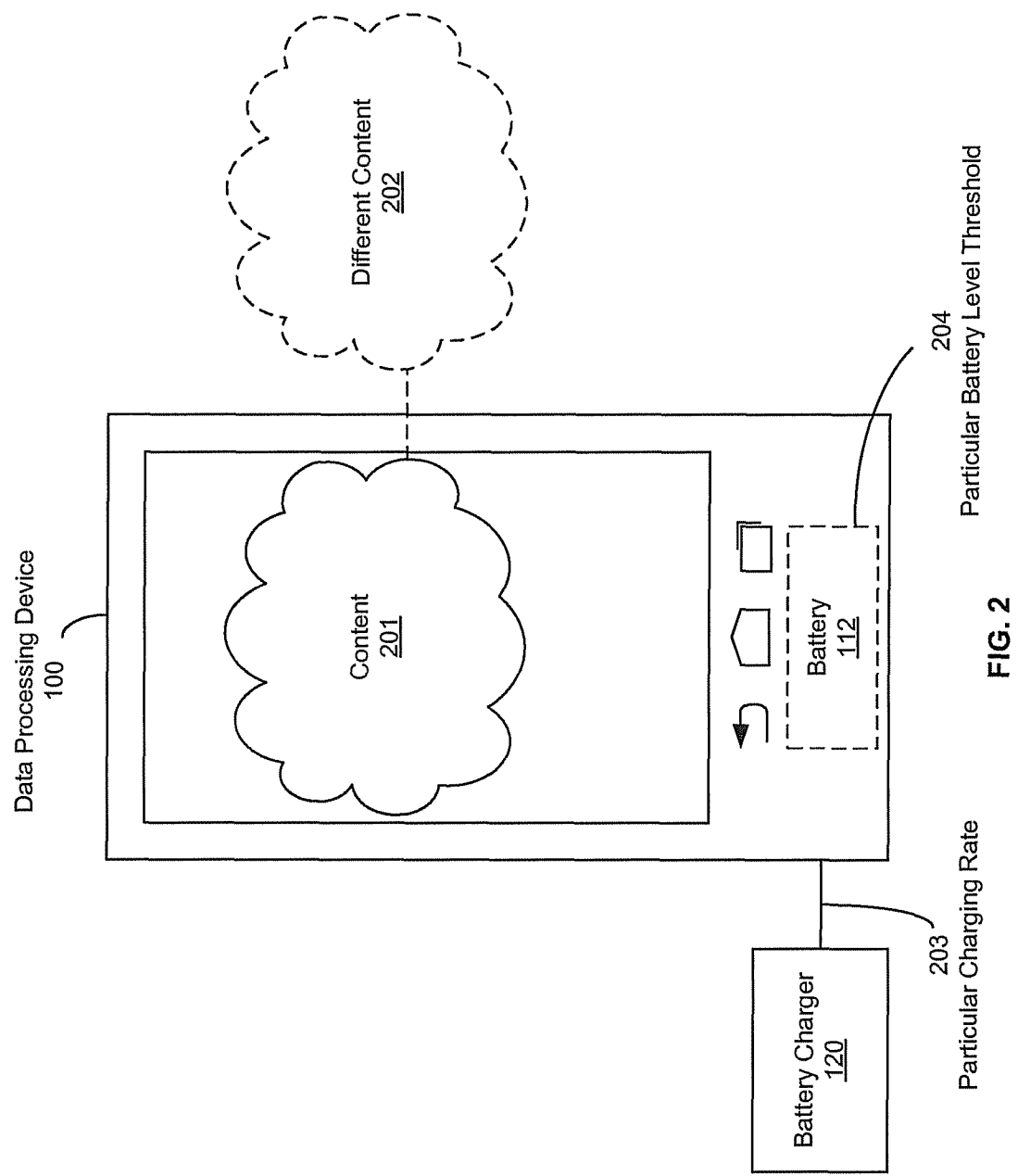
FIG. 2 is a diagram illustrating example scenarios of displaying content based on a charging condition of a battery, in accordance with an embodiment of the disclosure.

FIG. 2 is a diagram illustrating example scenarios of displaying content based on a charging condition of a battery, in accordance with an embodiment of the disclosure. These scenarios are provided by way of example illustration and not of limitation. Referring to FIG. 2, there is shown the data processing device 100 in a state of charging the battery 112. The data processing device 100 may be as described with respect to FIG. 1, for example.

In an example operation, the processor 108 in the data processing device 100 may be operable to determine that the data processing device 100 is inactive or idle. The processor 108 may also be operable to detect and determine that the data processing device 100 is in a state of charging the battery 112 of the data processing device 100 via connection to the battery charger 120. The attract mode control module 102 in the data processing device 100 may be operable to analyze a charging condition of the battery 112. In instances when the result of the analysis of the charging condition indicates that the battery 112 is being charged at a rate lower than a particular rate 203, the attract mode control module 102 may be operable to prevent activation of display of content such as the content 201 for attracting attention to the data processing device 100. In this regard, the content 201 may comprise, for example, a screensaver, a clock display, a news ticker, a photo frame, a game demo and/or a puzzle. In other instances when the result of the analysis of the charging condition indicates that the battery 112 is being charged at a rate lower than a particular rate 203 with the display of the content 201, the attract mode control module 102 may be operable to deactivate the display of the content 201 or choose display of a different content 202 if the display of the different content 202 may cause the battery 112 being charged at a rate equal to or higher than the particular rate 203. In another instances when the result of the analysis of the charging condition indicates that the battery 112 starts being charged at a battery level below a particular threshold 204, the attract mode control module 102 may be operable to prevent activation of the display of content such as the content 201.

Figure 3:
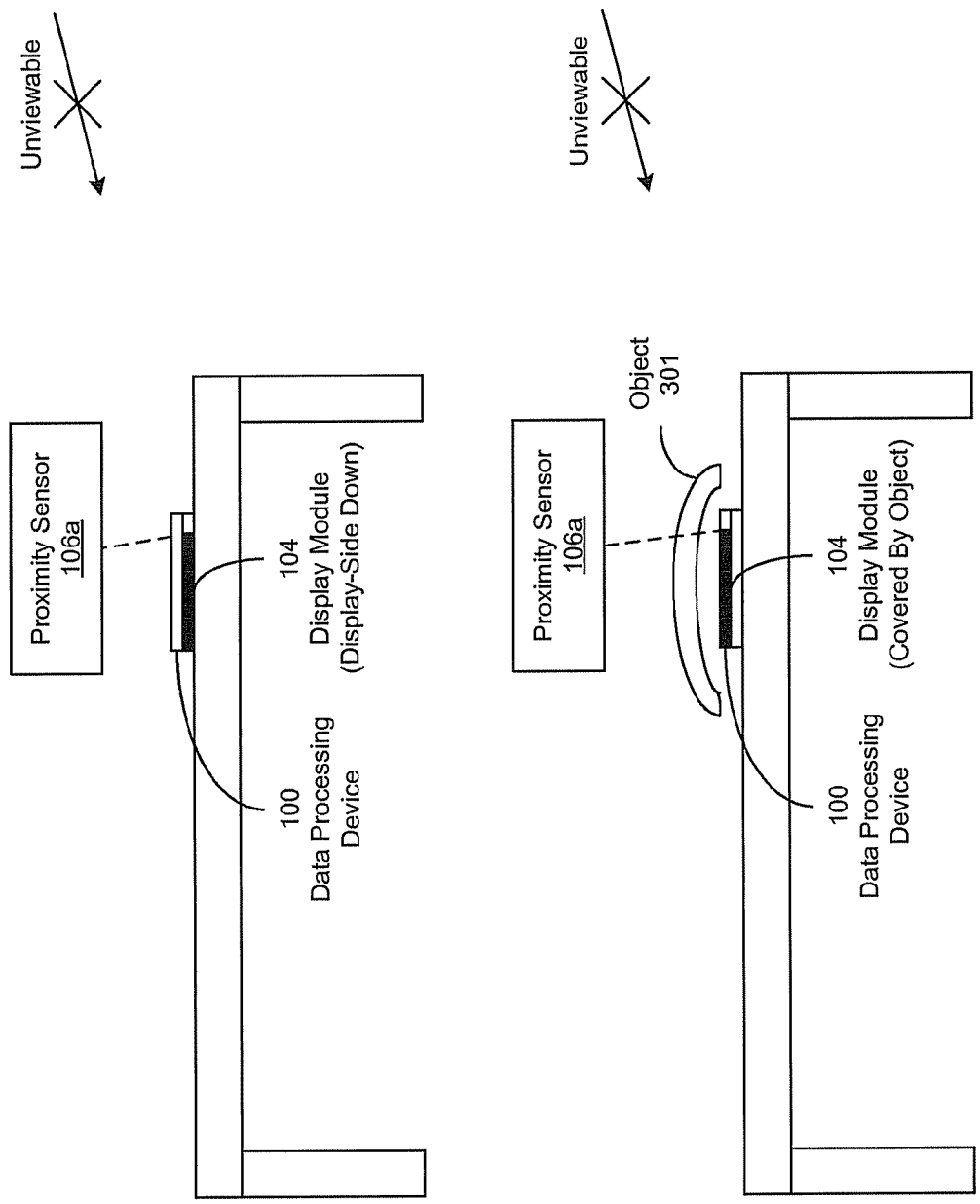
FIG. 3 is a diagram illustrating example scenarios of displaying content based on a viewability condition at a display module, in accordance with an embodiment of the disclosure.

FIG. 3 is a diagram illustrating example scenarios of displaying content based on a viewability condition at a display module, in accordance with an embodiment of the disclosure. These scenarios are provided by way of example illustration and not of limitation. Referring to FIG. 3, there is shown the data processing device 100. In one scenario, the data processing device 100 may be in a position of display-side down. In such instances, the display module 104 of the data processing device 100 may be considered to be unviewable. In another scenario, the data processing device 100 may be in a position that the display module 104 of the data processing device 100 is covered by an object such as the object 301. In such instances, the display module 104 of the data processing device 100 may be considered to be unviewable. The data processing device 100 may be as described with respect to FIG. 1, for example.

In an example operation, the processor 108 in the data processing device 100 may be operable to determine that the data processing device 100 is inactive or idle. The attract mode control module 102 in the data processing device may be operable to analyze, based on sensing information collected from the proximity sensor 106a in the data processing device 100, whether the display module 104 of the data processing device 104 is in an unviewable condition due to display-side down or an object such as the object 301 covering the display module 104. In instances when the display module 104 is analyzed to be unviewable, the attract mode control module 102 may be operable to prevent activation of display of content, at the display module 104. In some instances, the data processing device 100 may be in a state of charging the battery 110 of the data processing device 100, and activating the proximity sensor 106a may have battery impact. In this regard, the proximity sensor 106a may be utilized for collecting the sensing information, for example, only within a short time window (e.g., 20 seconds) starting at a time that the battery 112 starts being charged.

Figure 4:
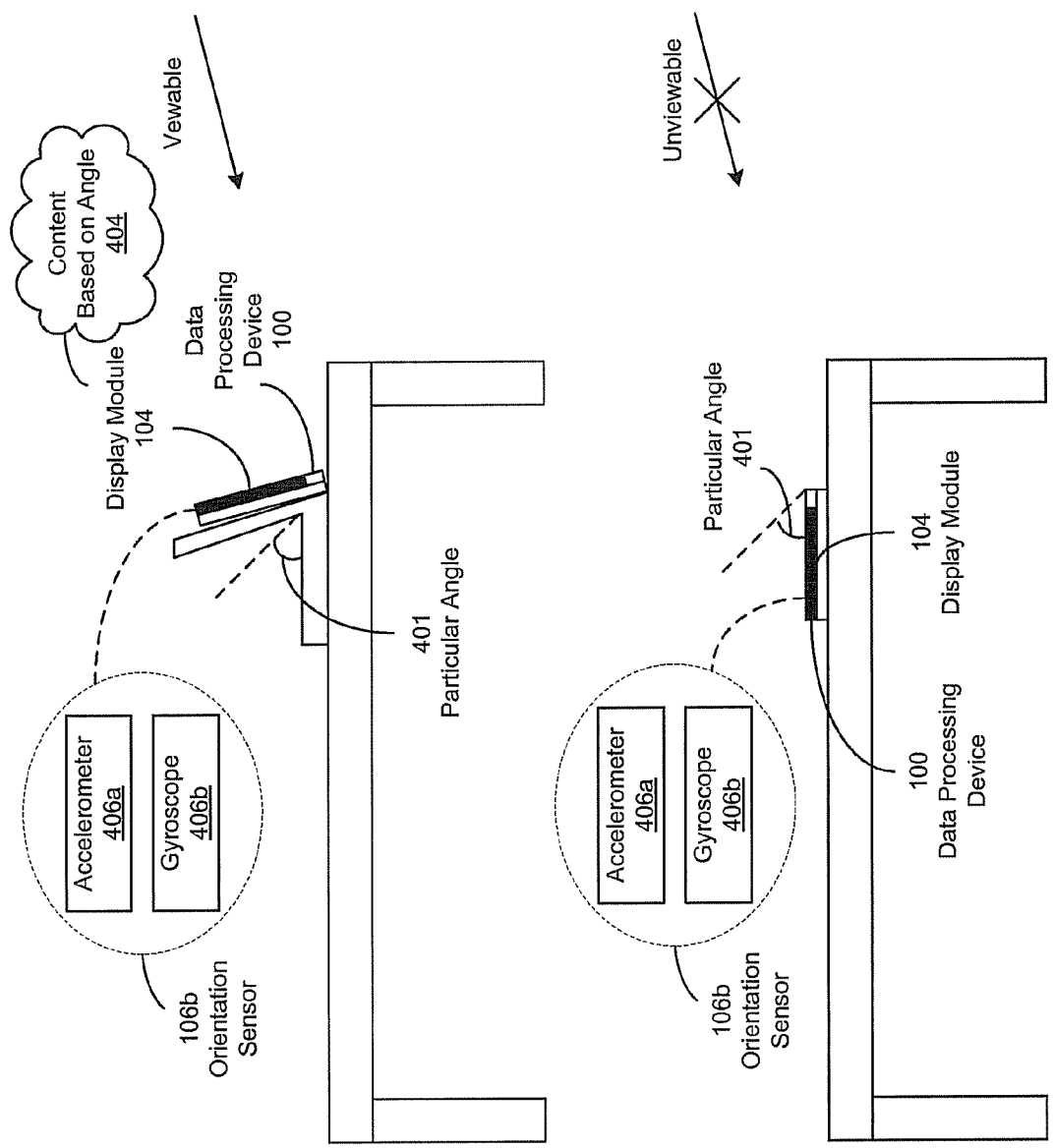
FIG. 4 is a diagram illustrating example scenarios of displaying content based on a vewability condition at a display module, in accordance with an embodiment of the disclosure.

FIG. 4 is a diagram illustrating example scenarios of displaying content based on a vewability condition at a display module, in accordance with an embodiment of the disclosure. These scenarios are provided by way of example illustration and not of limitation. Referring to FIG. 4, there is shown the data processing device 100. In one scenario, the data processing device 100 may be in a position that an angle which the data processing device 100 is oriented at relative to a horizontal plane is smaller than a particular angle 401 (e.g., 45 degrees). In such instances, the display module 104 of the data processing device 100 may be considered to be unviewable by someone nearby. In another scenario, the data processing device 100 may be in a position that an angle which the data processing device 100 is oriented at relative to a horizontal plane is greater than the particular angle 401. In such instances, the display module 104 of the data processing device 100 may be considered to be viewable by someone nearby (e.g., without having to look down from directly above). The data processing device 100 may be as described with respect to FIG. 1, for example.

In an example operation, the processor 108 in the data processing device 100 may be operable to determine that the data processing device 100 is inactive or idle. The attract mode control module 102 in the data processing device 100 may be operable to analyze, based on sensing information collected from the orientation sensor 106b in the data processing device 100, whether the display module 104 of the data processing device 100 is in an unviewable condition or in a viewable condition due to an angle the data processing device 100 is oriented at relative to a horizontal plane. In instances when the angle is analyzed to be smaller than the particular angle 401, the attract mode control module 102 may be operable to prevent activation of display of content at the display module 104. In instances when the angle is analyzed to be equal to or greater than the particular angle 401, the attract mode control module 102 may be operable to choose display of content such as the content 404 based on the angle. For example, content with different contrast may be displayed corresponding to different angle the data processing device 100 is oriented at relative to the horizontal plane. In some instances, the data processing device 100 may be in a state of charging the battery 110 of the data processing device 100, and activating the orientation sensor 106b may have battery impact. In this regard, the orientation sensor 106b may be utilized for collecting the sensing information, for example, only within a short time window (e.g., 20 seconds) starting at a time that the battery 112 starts being charged. The orientation sensor 106b may comprise, for example, an accelerometer 406a and/or a gyroscope 406b.

Figure 5:
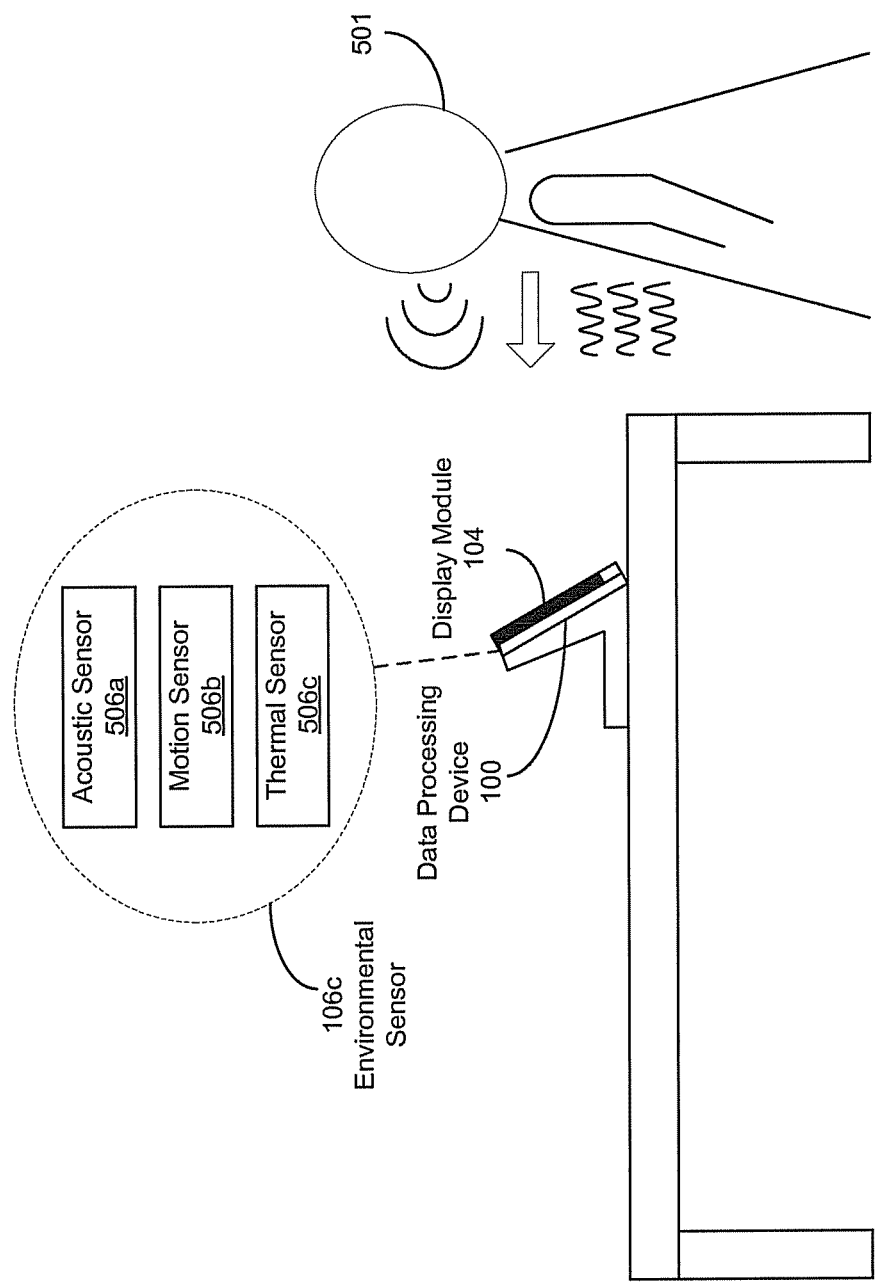
FIG. 5 is a diagram illustrating example scenarios of displaying content based on an environmental condition associated with proximity of a human, in accordance with an embodiment of the disclosure.

FIG. 5 is a diagram illustrating example scenarios of displaying content based on an environmental condition associated with proximity of a human, in accordance with an embodiment of the disclosure. These scenarios are provided by way of example illustration and not of limitation. Referring to FIG. 5, there is shown the data processing device 100 and a human 501 in an area proximal to the data processing device 100. The data processing device 100 may be as described with respect to FIG. 1, for example.

In an example operation, the processor 108 in the data processing device 100 may be operable to determine that the data processing device 100 is inactive or idle. The attract mode control module 102 in the data processing device may be operable to analyze, based on sensing information collected from the environmental sensor 106c in the data processing device 100, the environmental condition associated with proximity of a human such as the human 501 to the data processing device 100. In this regard, the environmental sensor 106c may comprise, for example, an acoustic sensor 506a, a motion sensor 506b and/or a thermal sensor 506c. The attract mode control module 102 may be operable to activate or deactivate, based on the result of the analysis of the environmental condition, display of content such as the content 201 (or 404) for attracting attention of the human 501 to the data processing device 100. For example, based on sensing information collected from the acoustic sensor 506a, the motion sensor 506b and/or the thermal sensor 506c, the attract mode control module 102 may determine that a human such as the human 501, who could be viewing content displayed at the display module 104 of the data processing device 100, is present in an area proximal to the data processing device 100. The attract mode control module 102 may then be operable to activate the display of the content 201 (or 404). In other instances, based on sensing information collected from the acoustic sensor 506a, the motion sensor 506b and/or the thermal sensor 506c, the attract mode control module 102 may determine that the data processing device 100 may be in a quiet environment without presence of a human. In such instances, the attract mode control module 102 may be operable to deactivate the display of the content 201 (or 404).

Figure 6:
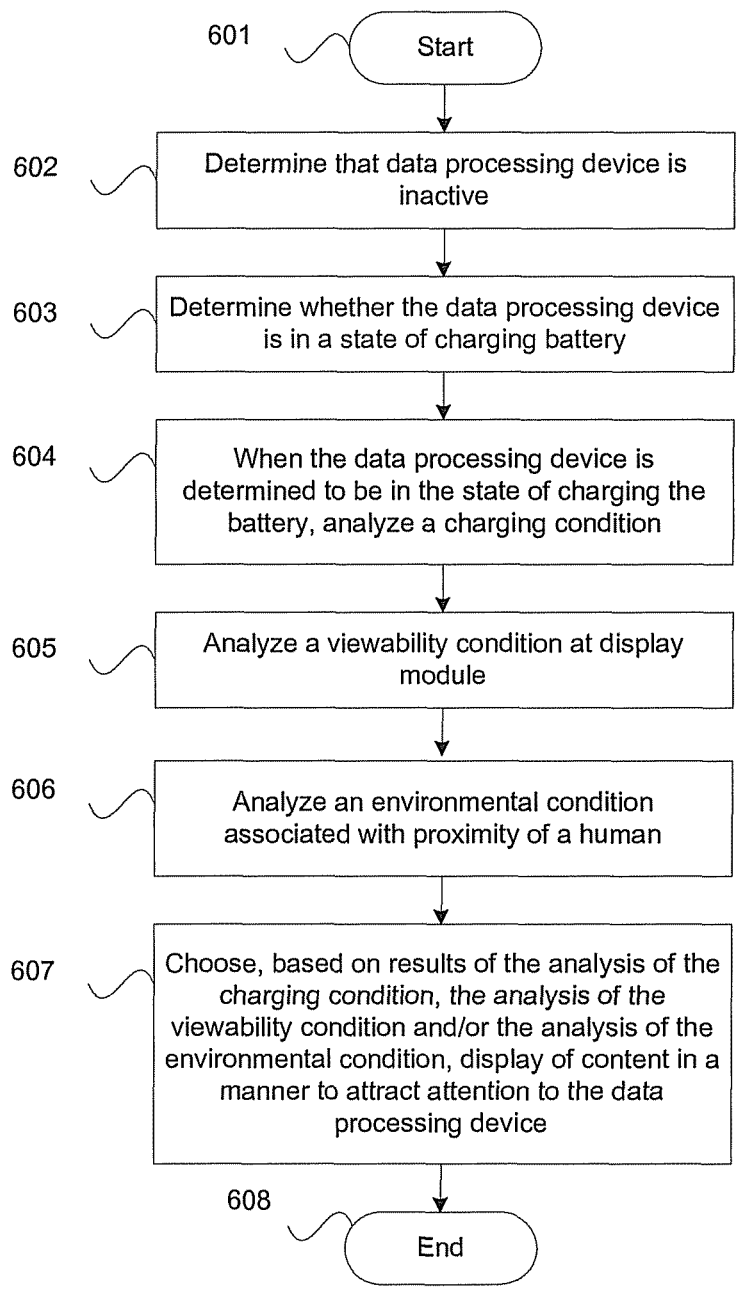
FIG. 6 is a flow chart illustrating example steps for triggering attract mode for a data processing device, in accordance with an embodiment of the disclosure.

FIG. 6 is a flow chart illustrating example steps for triggering attract mode for a data processing device, in accordance with an embodiment of the disclosure. Referring to FIG. 6, the example steps start at step 601. In step 602, the processor 108 in the data processing device 100 may be operable to determine that the data processing device 100 is inactive or idle. In step 603, the processor 108 may be operable to determine whether the data processing device 100 is in a state of charging the battery 112 of the data processing device 100. In step 604, in instances when the data processing device 100 is determined to be in the state of charging the battery 112, the attract mode control module 102 in the data processing device 100 may be operable to analyze a charging condition of the battery 112. In step 605, the attract mode control module 102 may be operable to analyze a viewability condition at the display module 104 of the data processing device 100. In step 606, the attract mode control module 102 may be operable to analyze an environmental condition associated with proximity of a human such as the human 501 to the data processing device 100. In step 607, the attract mode control module 102 may be operable to choose, based on a result of the analysis of the charging condition, a result of the analysis of the viewability condition and/or a result of the analysis of the environmental condition, display of content such as the content 201 (or 404) in a manner to attract attention to the data processing device 100. The example steps may proceed to the end step 608.

In various embodiments of the disclosure, a processor 108 in a data processing device 100 may be operable to determine that the data processing device 100 is inactive or idle. The processor 108 in the data processing device 100 may be operable to determine whether the data processing device 100 is in a state of charging a battery 112 of the data processing device 100. In instances when the data processing device 100 is determined to be in the state of charging the battery 112, a charging condition of the battery 112 may be analyzed by an attract mode control module 102 in the data processing device 100. The attract mode control module 102 in the data processing device 100 may be operable to analyze a viewability condition at a display module 104 of the data processing device 100. An environmental condition associated with proximity of a human such as the human 501 to the data processing device 100 may also be analyzed by the data processing device 100. The attract mode control module 102 in the data processing device 100 may then be operable to choose, based on a result of the analysis of the charging condition, a result of the analysis of the viewability condition and/or a result of the analysis of the environmental condition, display of content such as the content 201 (or 404) in a manner to attract attention to the data processing device. In this regard, the content 201 (or 404) displayed may comprise, for example, a screensaver, a clock display, a news ticker, a photo frame, a game demo, a puzzle and/or other interactive content.

The data processing device 100 may be operable to receive input comprising indication of disabling or enabling a portion of the analysis of the charging condition, a portion of the analysis of the viewability condition and/or a portion of the analysis of the environmental condition. The attract mode control module 102 may then be operable to disable or enable, based on the received input, the portion of the analysis of the charging condition, the portion of the analysis of the viewability condition and/or the portion of the analysis of the environmental condition.

In instances when the result of the analysis of the charging condition indicates that the battery 112 is being charged at a rate lower than a particular rate 203, the attract mode control module 102 may be operable to prevent activation of the display of the content 201. In instances when the result of the analysis of the charging condition indicates that the battery 112 is being charged at a rate lower than a particular rate 203 with the display of the chosen content 201, the attract mode control module 102 may be operable to deactivate the display of the chosen content 201 or choose display of a different content 202 if the display of the different content 202 may cause the battery 112 being charged at a rate equal to or higher than the particular rate 203. In instances when the result of the analysis of the charging condition indicates that the battery 112 starts being charged at a battery level below a particular threshold 204, the attract mode control module 102 may be operable to prevent activation of the display of the content 201.

The attract mode control, module 102 may be operable to analyze, based on sensing information collected from a proximity sensor 106a in the data processing device 100, whether the display module 104 of the data processing device 100 is in an unviewable condition due to display-side down or an object 301 covering the display module 104. In instances when the display module 104 is analyzed to be unviewable, the attract mode control module 102 may be operable to prevent activation of the display of the content 201. In some instances, the proximity sensor 106a may be utilized for collecting the sensing information, for example, within a first time window (e.g., 20 seconds) starting at a time that the battery 112 starts being charged.

The attract mode control module 102 may be operable to analyze, based on sensing information collected from an orientation sensor 106b in the data processing device 100, whether the display module 104 of the data processing device 100 is in an unviewable condition or in a viewable condition due to an angle the data processing device is oriented at relative to a horizontal plane. In instances when the angle is analyzed to be smaller than a particular angle 401 (e.g., 45 degrees), the attract mode control module 102 may be operable to prevent activation of the display of the content 201 (or 404). In instances when the angle is analyzed to be equal to or greater than the particular angle 401, the attract mode control module 102 may be operable to choose the display of the content 404 based on the angle. In some instances, the orientation sensor 106b may be utilized for collecting the sensing information, for example, within a second time window (e.g., 20 seconds) starting at a time that the battery 112 starts being charged. In this regard, the orientation sensor 106b may comprise, for example, an accelerometer 406a and/or a gyroscope 406b.

The attract mode control module 102 may be operable to analyze, based on sensing information collected from an environmental sensor 106c in the data processing device 100, the environmental condition associated with proximity of the human 501 to the data processing device 100. The attract mode control module 102 may be operable to activate or deactivate, based on the result of the analysis of the environmental condition, the display of the content 201 (or 404). In this regard, the environmental sensor 106c may comprise, for example, an acoustic sensor 506a, a motion sensor 506b and/or a thermal sensor 506c.

Other embodiments of the disclosure may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for triggering attract mode for devices.

Accordingly, aspects of the present disclosure may be realized in hardware, software, or a combination of hardware and software. Aspects of the present disclosure may be realized in a centralized fashion in at least one computer system or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

Aspects of the present disclosure may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A method, comprising:
   in a data processing device:
      determining whether the data processing device is in a state of charging a battery of the data processing device;
      when the data processing device is determined to be in the state of charging the battery, analyzing a charging condition of the battery;
      analyzing a viewability condition at a display module of the data processing device based on viewability data received within an adjustable time window via one or more of a proximity sensor in the data processing device and an orientation sensor in the data processing device, wherein the adjustable time window begins when the data processing device is determined to be in the state of charging the battery;
      analyzing an environmental condition associated with proximity of a human to the data processing device; and
      providing a display of content in a manner to attract attention to the data processing device based on one or more of: a result of the analysis of the charging condition, a result of the analysis of the viewability condition, and a result of the analysis of the environmental condition.

2. The method according to claim 1, wherein the data processing device is inactive.

3. The method according to claim 1, wherein the content includes one or more of a screensaver, a clock display, a news ticker, a photo frame, a game demo, and a puzzle.

4. The method according to claim 1, comprising:
   receiving input comprising indication of disabling or enabling a portion of the analysis of the charging condition, a portion of the analysis of the viewability condition and/or a portion of the analysis of the environmental condition; and
   disabling or enabling, based on the received input, the portion of the analysis of the charging condition, the portion of the analysis of the viewability condition and/or the portion of the analysis of the environmental condition.

5. The method according to claim 1, comprising, when the result of the analysis of the charging condition indicates that the battery is being charged at a rate lower than a particular rate, preventing activation of the display of the content.

6. The method according to claim 1, comprising, when the result of the analysis of the charging condition indicates that the battery is being charged at a rate lower than a particular rate with the display of the chosen content, deactivating the display of the chosen content or providing a display of a different content if the display of the different content causes the battery being charged at a rate equal to or higher than the particular rate.

7. The method according to claim 1, comprising when the result of the analysis of the charging condition indicates that the battery starts being charged at a battery level below a particular threshold, preventing activation of the display of the content.

8. The method according to claim 1, comprising:
analyzing, based on the viewability data received via the proximity sensor in the data processing device, whether the display module of the data processing device is in an unviewable condition due to display-side down or an object covering the display module; and
when the display module is analyzed to be unviewable, preventing activation of the display of the content.

9. The method according to claim 1, comprising:
analyzing, based on the viewability data received via the orientation sensor in the data processing device, whether the display module of the data processing device is in an unviewable condition or in a viewable condition due to an angle the data processing device is oriented at relative to a horizontal plane;
when the angle is analyzed to be smaller than a particular angle, preventing activation of the display of the content; and
when the angle is analyzed to be equal to or greater than the particular angle, providing the display of the content based on the angle.

10. The method according to claim 1, wherein the orientation sensor comprises an accelerometer and/or a gyroscope.

11. The method according to claim 1, comprising:
analyzing, based on sensing information collected from an environmental sensor in the data processing device, the environmental condition associated with proximity of the human to the data processing device; and
activating or deactivating, based on the result of the analysis of the environmental condition, the display of the content.

12. The method according to claim 11, wherein the environmental sensor comprises an acoustic sensor, a motion sensor and/or a thermal sensor.

13. A system, comprising:
a data processing device, wherein the data processing device is operable to:
determine whether the data processing device is in a state of charging a battery of the data processing device;
when the data processing device is determined to be in the state of charging the battery, analyze a charging condition of the battery;
analyze a viewability condition at a display module of the data processing device based on viewability data received within an adjustable time window via one or more of a proximity sensor in the data processing device and an orientation sensor in the data processing device, wherein the adjustable time window begins when the data processing device is determined to be in the state of charging the battery;
analyze an environmental condition associated with proximity of a human to the data processing device; and
provide a display of content in a manner to attract attention to the data processing device based on one or more of: a result of the analysis of the charging condition, a result of the analysis of the viewability condition, and a result of the analysis of the environmental condition.

14. The system according to claim 13, wherein, when the result of the analysis of the charging condition indicates that the battery is being charged at a rate lower than a particular rate, the data processing device is operable to prevent activation of the display of the content.

15. The system according to claim 13, wherein, when the result of the analysis of the charging condition indicates that the battery starts being charged at a battery level below a particular threshold, the data processing device is operable to prevent activation of the display of the content.

16. The system according to claim 13, wherein the data processing device is operable to:
analyze, based on the viewability data received via the proximity sensor in the data processing device, whether the display module of the data processing device is in an unviewable condition due to display-side down or an object covering the display module; and
when the display module is analyzed to be unviewable, prevent activation of the display of the content.

17. The system according to claim 13, wherein the data processing device is operable to:
analyze, based on the viewability data received via the orientation sensor in the data processing device, whether the display module of the data processing device is in an unviewable condition or in a viewable condition due to an angle the data processing device is oriented at relative to a horizontal plane;
when the angle is analyzed to be smaller than a particular angle, prevent activation of the display of the content; and
when the angle is analyzed to be equal to or greater than the particular angle, provide the display of the content based on the angle.

18. The system according to claim 13, wherein the data processing device is operable to:
analyze, based on sensing information collected from an environmental sensor in the data processing device, the environmental condition associated with proximity of the human to the data processing device; and
activate or deactivate, based on the result of the analysis of the environmental condition, the display of the content.

19. The method according to claim 1, wherein analyzing the viewability condition at the display module of the data processing device based on viewability data received within the adjustable time window via one or more of the proximity sensor and the orientation sensor comprises:
analyzing the viewability condition based on at least a first portion of the viewability data received within a first adjustable time window via the proximity sensor and/or based on at least a second portion of the viewability data received within a second adjustable time window via the orientation sensor, wherein the first adjustable time window and the second adjustable time window begin when the data processing device is determined to be in the state of charging the battery.

* * * * *